United States Patent [19]

Sotani et al.

[11] Patent Number: 5,054,296
[45] Date of Patent: Oct. 8, 1991

[54] PIPE FOR COOLING UNIT, COOLING UNIT AND INDIVIDUAL COOLING SYSTEM

[75] Inventors: Junji Sotani, Yokohama; Tetsuo Okuyama, Tokyo; Susumu Seo, Yokohama; Tohru Ohi, Machida; Naoki Mori, Yokohama; Minoru Mabuchi, Sagamihara, all of Japan

[73] Assignee: Furukawa Electric Co., Ltd., Tokyo, Japan

[21] Appl. No.: 523,400

[22] Filed: May 15, 1990

[30] Foreign Application Priority Data

| May 16, 1989 | [JP] | Japan | 1-122462 |
| May 16, 1989 | [JP] | Japan | 1-122464 |
| May 16, 1989 | [JP] | Japan | 1-122465 |
| Apr. 20, 1990 | [JP] | Japan | 2-105059 |

[51] Int. Cl.$^5$ .............................................. F25D 23/12
[52] U.S. Cl. .................................... 62/259.1; 62/119; 62/419; 62/440
[58] Field of Search ............... 62/119, 259.1, 419, 62/440

[56] References Cited

U.S. PATENT DOCUMENTS

| 2,350,348 | 6/1944 | Gaugler | 62/119 |
| 2,499,736 | 3/1950 | Kleen | 62/119 X |
| 3,848,424 | 11/1974 | Rhea | 62/119 X |
| 4,135,371 | 1/1979 | Kesselring et al. | 62/119 X |
| 4,317,336 | 3/1982 | Bennett et al. | 62/119 X |
| 4,638,646 | 1/1987 | Koseki et al. | 62/119 X |

Primary Examiner—Lloyd L. King
Attorney, Agent, or Firm—Thomas R. Morrison

[57] ABSTRACT

A pipe for a cooling unit comprises an outer pipe, and an inner pipe shorter than the outer pipe and located at an evaporating portion in the outer pipe, a circulation gap being defined between the inner wall surface of the outer pipe and the outer wall surface of the inner pipe and leading from one end to the other end of the inner pipe, whereby working liquid is permitted to boil up continuously and stably in the evaporating portion even uder a low temperature flow of working liquid. Also, a cooling unit comprises a plurality of pipes for the cooling unit as noted above, which are arranged as standing side by side vertically or obliquely, and upper and lower header pipes communicating to the upper and lower ends of these pipes, respectively, whereby the thermal conductivity is increased even under the low temperature flow of working liquid, and a plurality of portions to be individually cooled are permitted to be cooled down in case of employment of a heat pipe cooling system for cooling, even if the levels of these portions differ from each other. An individual cooling system comprises a plurality of cooling units as noted above to circulate the refrigerant, whereby a plurality of partitioned spaces are permitted to be cooled down individually and efficiently.

15 Claims, 11 Drawing Sheets

FIG. 15
FIG. 16
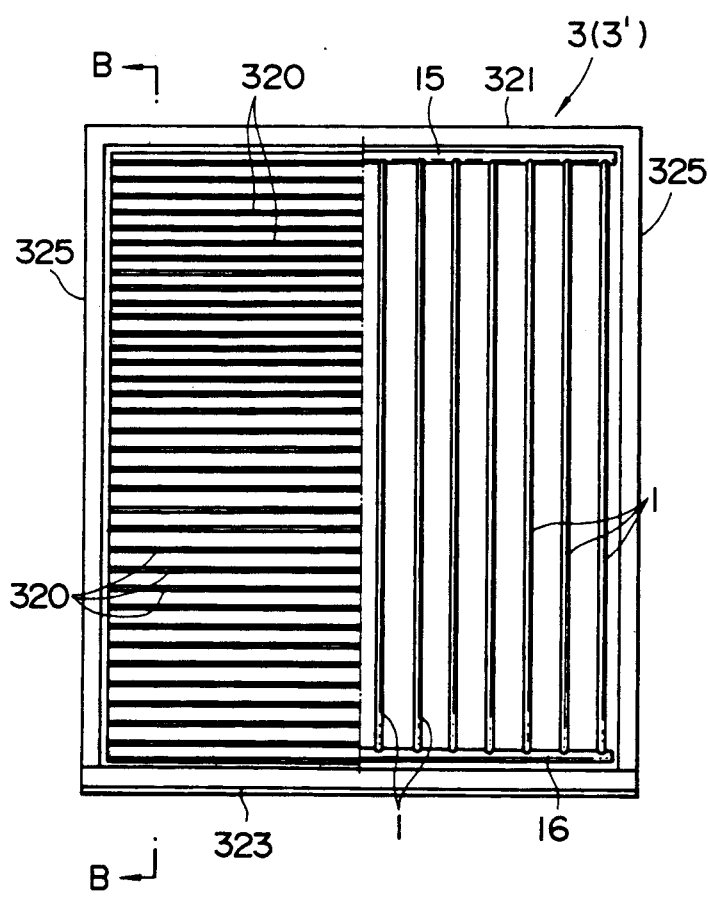
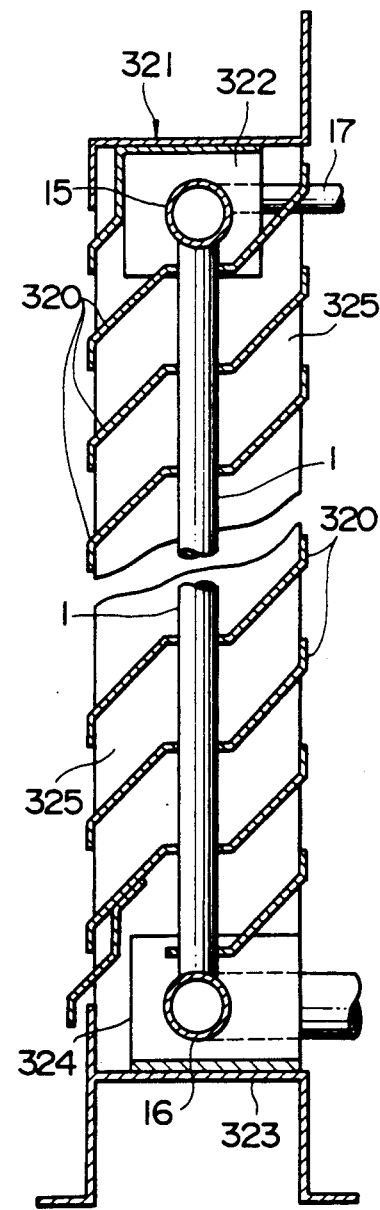

PIPE FOR COOLING UNIT, COOLING UNIT AND INDIVIDUAL COOLING SYSTEM

BACKGROUND OF THE INVENTION

1. Field of the Invention

This invention relates to a pipe for a cooling unit to evaporate working liquid in a heat exchange system of heat pipe type, a cooling unit using such pipe and an individual cooling system capable of cooling each exothermic apparatus (Office Automation apparatus and information apparatus or the like) installed on one floor or each individual space.

2. Description of the Prior Art

Conventionally, a pipe for use in this kind of cooling unit has an evaporating portion c formed of a single pipe as shown in FIG. 2.

In case where the prior art pipe for the cooling unit as shown in FIG. 2 is used with the evaporating portion c vertically held or largely inclined to the horizontal direction, since the evaporating portion c is formed of the single pipe, working liquid a successively boils up inside the evaporating portion in high heat flow of the working liquid. Accordingly, the thermal conductivity is made high. However, as the intense heat flow is reduced, bubbles b resulting from the boiling of the working liquid a stay on the level of the working liquid a within the evaporating portion c to produce the distribution of temperature of the working liquid a in the evaporating portion c, so that the thermal conductivity is remarkably reduced.

Thus, the boiling of the working liquid a in the evaporating portion c becomes intermittent with the lapse of time, and the operation becomes extremely unstable to further reduce the thermal conductivity.

Generally, in the cooling unit of a heat exchange system of heat pipe type, the level of the working liquid a within the evaporating portion c should be set as high as possible in order to facilitate the boiling, and the quantity of working liquid a to be enclosed inside the evaporating portion is increased by the quantity corresponding to the elevated level, so that the start of the whole system takes a long time until the system is stationarily operated.

Also, in case where one floor is partitioned into a plurality of spaces by partitions, and an exothermic apparatus or the like is installed in each of the partitioned spaces, when each space is individually cooled down by a heat exchange system of separate heat pipe type, the heights of portions to be individually cooled from the floor surface are often different from each other, and it has been impossible for each cooling unit using the prior art pipe as shown in FIG. 2 to individually cool down the portions different from each other in height from the level of the working liquid while maintaining the levels of working liquid of respective cooling units on the same floor to be identical with each other. As a result, there has not yet been proposed a system for individually cooling down a plurality of individual spaces on the same floor while performing the heat exchange through a heat pipe system.

SUMMARY OF THE INVENTION

It is an object of the present invention to provide a pipe having high thermal conductivity even under a low temperature flow of working liquid in a cooling unit for use in a heat exchange system of heat pipe type.

Another object of the present invention is to provide a pipe for a cooling unit, which permits working liquid to continuously boil up even under a low temperature flow of working liquid and thus operates more stably.

A further object of the present invention is to provide a cooling unit, which permits the level of working liquid in an evaporating portion to be made lower, thus reduces the quantity of working liquid to be enclosed in the evaporating portion, and also makes shorter the time taken from the start of the system till the stationary running thereof.

A still further object of the present invention is to provide a cooling unit, which permits working liquid to continuously boil up even under a low temperature flow of working liquid, and maintains high thermal conductivity.

A yet further object of the present invention is to provide an individual cooling system, which maintains the levels of working liquid on the same floor to be indential with each other while performing the heat exchange through a heat pipe system, and is capable of individually cooling down portions to be cooled, which are different from each other in height from the level of working liquid.

According to one aspect of the present invention, there is provided a pipe for a cooling unit comprising an outer pipe and an inner pipe shorter than the outer pipe and located at an evaporating portion in the outer pipe, a circulation gap being defined between the inner wall surface of the outer pipe and the outer wall surface of the inner pipe and leading from one end to the otehr end of the inner pipe.

The circulation gap between the inner pipe and the outer pipe does not need to be strictly constant through the total length of the inner pipe, and a circulation gap leading from one end to the other end of the inner piep will suffice for the operation of the system.

The size of the circulation gap between the inner pipe and the outer pipe is properly set according to the amount of heat flow of working liquid, preferably within the range of 0.1 to 1.5 mm.

As the material of the outer pipe, use is made of metal having high thermal conductivity such as aluminum, copper and alloy of these metals, similarly to the case of the prior art pipe for the cooling unit. On the other hand, as the material of the inner pipe, use is made of metal, plastic or other material so long as it has adaptability to the working liquid.

The pipe for the cooling unit as noted above is easily manufactured according to the following three methods, for example.

A first method is as follows:

An outer pipe having the smooth inner surface and an inner pipe having the smooth outer surface are manufactured by proper means, then the inner pipe is inserted into the outer pipe, and thereafter several spacers are forcibly inserted between the outer pipe and the inner pipe, or the inner pipe is protruded in several portions toward the outer periphery, or the outer pipe is protruded in several portions toward the inner periphery to fix the outer pipe and the inner pipe to each other.

A second method is as follows:

An outer pipe having irregularities on its inner surface is manufactured by proper means, and then an inner pipe is forcibly inserted into the outer pipe, or the inner pipe is somewhat expanded after the inner pipe is inserted into the outer pipe.

A third method is as follows:

An inner pipe having a proper number of fins or irregularities on its outer surface is manufactured by proper means, and then the inner pipe is forcibly inserted into an outer pipe, or the inner pipe is expanded after the inner pipe is inserted into the outer pipe.

In case where the circulation gap between the outer pipe and the inner pipe is as very narrow as 0.2 mm or less on an average, for example, the inner pipe may be only inserted into the outer pipe since the sections of both pipes are not strictly similar to each other in most cases.

The sections of the outer and inner pipes are preferably similar to each other. However, both pipes do not need to be similar to each other so long as the circulation gap is formed between the inner pipe and the outer pipe as noted above.

Further, the outer pipe and the inner pipe constituting the pipe for the cooling unit according to the present invention take not only the circular shape, but also the elliptical or other shape in cross-section.

According to another aspect of the present invention, there is provided a cooling unit comprising a plurality of pipes, each of which is composed of an outer pipe and an inner pipe shorter than the outer pipe and located at an evaporating portion in the outer pipe, a circulation gap being defined between the inner wall surface of the outer pipe and the outer wall surface of the inner pipe and leading from one end to the other end of the inner pipe, the plurality of pipes being arranged as vertically or obliquely standing side by side, an upper header pipe communicating to the upper end of each pipe and a lower header pipe communicating to the lower end of each pipe.

Preferably, the upper header pipe and the lower header pipe are supported by a proper frame or a hollow panel, and heat-absorbing fins or the like are mounted to the pipe.

More preferably, fins or irregularities are formed also on the frame or the hollow panel, or longitudinal grooves each having the arcuate shape in cross-section are formed in the frame or the hollow panel, and each pipe is guided to the inside of the corresponding one of the longitudinal grooves.

In the cooling unit as noted above, a vapor-liquid separating pipe having the diameter smaller than that of the upper header pipe preferably communicates to the upper header pipe.

When the cooling unit and the pipe for the cooling unit according to the present invention are used under the condition that the level of working liquid is located within the evaporating portion provided in the inner pipe, the working liquid particularly in a low temperature flow boils up mainly within the narrow circulation gap between the inner pipe and the outer pipe, and this boiling of working liquid results in the removal of ambient heat to cool down a space in the periphery of the evaporating portion.

When the working liquid boils up within the circulation gap, the working liquid changed into a vapor phase results in bubbles in the working liquid left in the liquid phase, and these bubbles are united with continuously produced bubbles, without staying in one spot, to rapidly expand as ascending through the narrow circulatin gap. The expansion and ascending of bubbles cause the unboil working liquid within the circulation gap to be lifted up, so that the ascending turbulence of vapor phase and liquid phase occurs within the circulation gap, and the working liquid which does not boil up until it is lifted up to the upper end of the circulation gaps drops into the inside of the inner pipe.

In this manner, the turbulence occurs within the circulation gap by the repetition of boiling, so that the distribution of temperature is less liable to occur in the working liquid within the circulation gap, and besides, the abrupt boiling is hard to be produced. Therefore, the thermal conductivity is made high even under the low temperature flow or working liquid, and the operation of the evaporating portion becomes extremely stable.

Further, even if the level of working liquid is located low in the inside of the inner pipe, the repetition of boiling within the circulation gap and the occurrence of ascending turbulence of bubbles and working liquid do not give any adverse influence to the thermal conduction, so that the quantity of working liquid to be enclosed in the heat exchange system is permitted to be lessened, and the time taken from the start till the stationary running of the system is made shorter.

A force, of which the bubbles resulting from the boiling of the working liquid within the circulation gap expand as ascending, is influenced by the size of the circulation gap. Thus, the ascending force of the bubbles becomes stronger the narrower the circulation gap is made, so that unboil working liquid within the circulation gap is more higher lifted up by the bubbles.

According to a further aspect of the present invention, there is provided an individual cooling system comprising the cooling unit as described in the above-mentioned aspect of the present invention, the cooling unit being installed in the vicinity of an Office Automation apparatus or like exothermic apparatus installed on the same floor, and/or inside a hollow partition, the lower header pipe of each cooling unit communicating to a piping of liquid-phase refrigerant provided inside a floor slab of the corresponding floor or inside a double-floor, the upper header pipe of each cooling unit communicating to a piping of vapor-phase refrigerant, the piping of liquid-phase refrigerant and the piping of vapor-phase refrigerant communicating to a terminal heat exchanger, and a liquid level regulator being installed in the piping of liquid-phase refrigerant.

When the individual cooling system according to the present invention is used under the condition that the level of working liquid is located at a portion (evaporating portion) between the upper end and the lower end of each inner pipe of several pipes of each cooling unit, the working liquid mainly boils up within the circulation gap of a double pipe portion to absorb the ambient heat of the double pipe portion for cooling down the peripheral space. The working liquid circulates such that the evaporated working liquid passes through the piping of vapor-phase refrigerant and reaches the terminal heat exchanger to be condensed, and then the condensed working liquid flows through the piping of liquid-phase refrigerant by the action of gravity and reaches the evaporating portion of each cooling unit to be again subjected to boiling.

The condition of the boiling of working liquid within each pipe of the cooling unit is similar to that described with reference to the afore-mentioned cooling unit and pipe for the cooling unit.

In the evaporating portion of the pipe of the cooling unit, the ascending force of the bubbles resulting from the boiling of working liquid varies depending on the size of the circulation gap. Therefore, when the respective portions to be cooled in the vicinity of the exothermic apparatus or the partition are different from each other in height from the level of working liquid (for instance, the exothermic portion of one exothermic apparatus is 40 to 60 cm high from the level of working liquid, while that of another exothermic apparatus is 70 to 100 cm high from the level of working liquid), the preferred individual cooling is performed by properly setting the circulation gap between the inner pipe and the outer pipe in each cooling unit to overcome the difference in height of the portions to be cooled from the level of working liquid.

According to a still further aspect of the present invention, there is provided an individual cooling system comprising the cooling unit as described in the afore-mentioned aspect of the present invention, the cooling unit being installed in a portion of a ventilating space communicating to the inside of a hollow partition from the vicinity of an Office Automation apparatus or like exothermic apparatus installed on a desk or a table or a cabinet (hereinafter will be simply referred to as desk or the like) installed in a portion of a floor partitioned by the hollow partition, a blower fan installed in the portion of the ventilating space and sending the exhaust heat from the exothermic apparatus to the cooling unit to send air cooled down to a proper temperature in the cooling unit to the inside of the partition, a blow-off port formed in the surface of the partition, which is directed to the space where the desk or the like is installed, and leading from the inside of the partition to the outside, the lower header pipe of each cooling unit communicating to a piping of liquid-phase refrigerant provided inside a floor slab of the corresponding floor or inside a double-floor, the upper header pipe of each cooling unit communicating to a piping of vapor-phase refrigerant, the piping of liquid-phase refrigerant and the piping of vapor-phase refrigerant communicating to a terminal heat exchanger, and a liquid level regulator being installed in the piping of liquid-phase refrigerant.

According to this individual cooling system, when it is operated under the condition that the level of working liquid is located at a portion (evaporating portion) between the lower end and the upper end of each inner pipe of several pipes of each cooling unit, the exhaust heat from the exothermic apparatus is sent to each cooling unit by the blower fan, and the air cooled down to a proper temperature in the cooling unit is blown off from the blow-off port of the partition through the partition, so that the exhaust heat from each exothermic apparatus is individually cooled down.

The working liquid mainly boils up within the circulation gap of a double pipe portion in each cooling unit to absorb the ambient heat of the double pipe portion for cooling. The working liquid circulates such that the resultant vapor passes through the piping of vapor-phase refrigerant and reaches the terminal heat exchanger to be condensed, and the condensed working liquid flows through the piping of liquid-phase refrigerant by the action of gravity and reaches the evaporating portion of each cooling unit to be again subjected to boiling.

In this individual cooling system, the preferred individual cooling is also performed by properly setting the circulation gap between the inner pipe and the outer pipe.

In each individual cooling system, the upper header pipe of each cooling unit communicates to the piping of vapor-phase refrigerant through a vapor-liquid separating pipe, and the piping of vapor-phase refrigerant is provided inside the floor slab of the corresponding floor, or inside the double-floor, so that the piping of vapor-phase refrigerant is set inconspicuously without damaging the indoor appearance.

The respective individual cooling systems as noted above are permitted to individually cool down the whole building having a plurality of floors, if the systems are selectively installed on all or a part of the floors and a cooling water piping is provided to circulated the cooling water from a cold heat source installed on a proper place of the building through each terminal heat exchanger again to the cold heat exchanger.

Other features and advantages of the invention will be apparent from the following detailed description of the invention.

BRIEF DESCRIPTION OF THE DRAWINGS

FIG. 15 is a front view, partly omitted, showing a modification of the cooling unit according to the present invention;

FIG. 16 is an enlarged-scale sectional view, partly omitted, taken along a line B—B indicated by an arrow in FIG. 15;

DESCRIPTION OF THE PREFERRED EMBODIMENTS

Figure 1:
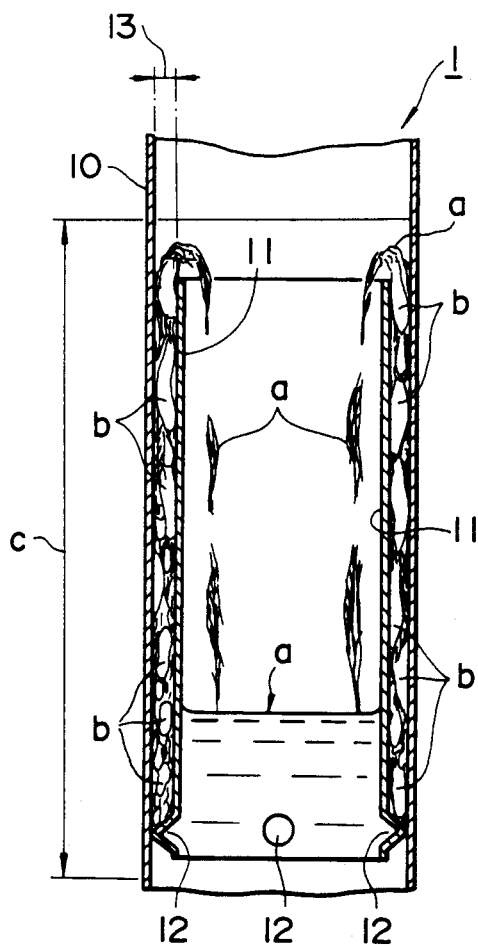
FIG. 1 is a fragmentary enlarged-scale sectional view showing an embodiment of a pipe for a cooling unit according to the present invention.

First will be specifically described an embodiment of a pipe for a cooling unit according to the present invention with reference to FIG. 1.

A pipe 1 for a cooling unit is manufactured by the steps of inserting an inner pipe 11 formed of a copper pipe having an outer diameter of 22.2 mm, an inner diameter of 20.2 mm and the length of 500 mm into an outer pipe 10 formed of a copper pipe having an outer diameter of 25.4 mm, an inner diameter of 23 mm and the length of 550 mm, then placing the inner pipe 11 in a substantially central portion of the outer pipe 10 in its length direction, then forming four convex projection portions 12 by protruding a lower end portion of the inner pipe 11 in four positions at substantially uniform intervals to such an extent that the four lower end portions of the inner pipe 11 are brought into contact with an inner peripheral wall of the outer pipe 10, and then fixing the inner pipe 11 to the inside of the outer pipe 10. The pipe 1 for a cooling unit manufactured in this manner has a circulation gap 13 of 0.4 mm on an average between the inner surface of the outer pipe 10 and the outer surface of the inner pipe 11.

Figure 5:
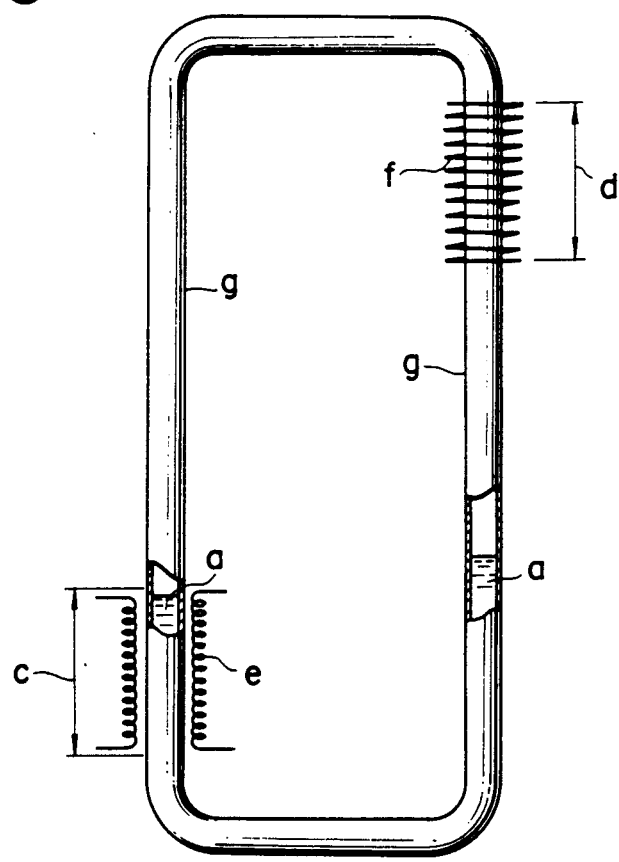
FIG. 5 is a schematic piping diagram showing an experimental heat exchanger for testing an effect of the pipe in accordance with the embodiment of FIG. 1.

As shown in FIG. 5, an experimental heat exchanger of heat pipe type is provided by forming a circulation piping g having an evaporating portion c provided with a heater e on its outer periphery and a condensing portion d formed with fins f, and enclosing working liquid a of Freon R-113 in the circulation piping g after the inside of the circulation piping is evacuated to fall into a saturable condition. Two experimental heat exchangers of heat pipe type as noted above are prepared.

Figure 2:
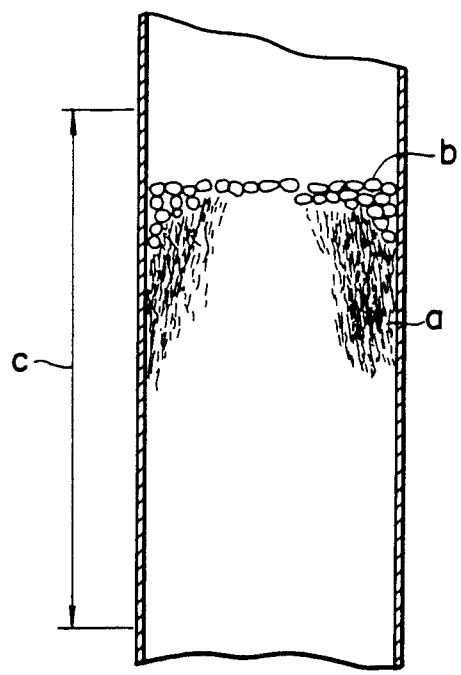
FIG. 2 is a fragmentary enlarged-scale sectional view showing a prior art pipe for a cooling unit.

The pipe of the embodiment of FIG. 1 is incorporated in the evaporating poriton c of one experimental heat exchanger so that the outer pipe of FIG. 1 is connected to the circulation piping g, and a prior art cooling unit pipe formed of a single copper pipe having an outer diameter of 25.4 mm, an inner diameter of 23 mm and the length of 550 mm as shown in FIG. 2 is incorporated in the evaporating portion c of the other experimental heat exchanger for making an experiment in heat conduction, respectively.

In these two experimental heat exchangers, the level of working liquid a is set to be on a level of 100 mm from the lower end of the inner pipe 11 of FIG. 1 in case of the former experimental heat exchanger using the pipe of the embodiment of FIG. 1, while the level of working liquid a is set to be on a level of an upper end portion (where the highest thermal conductivity is obtained) of the evaporating portion in case of the latter experimental heat exchanger using the prior art single pipe without any inner pipe. Then, an experiment is made according to the procedure of heating the evaporation portion c while maintaining the vapor temperature at 40° C., and cooling the evaporated vapor-phase working liquid in the condensing portion d. The result of the experiment made according to these procedure is as shown in FIG. 6.

Figure 6:
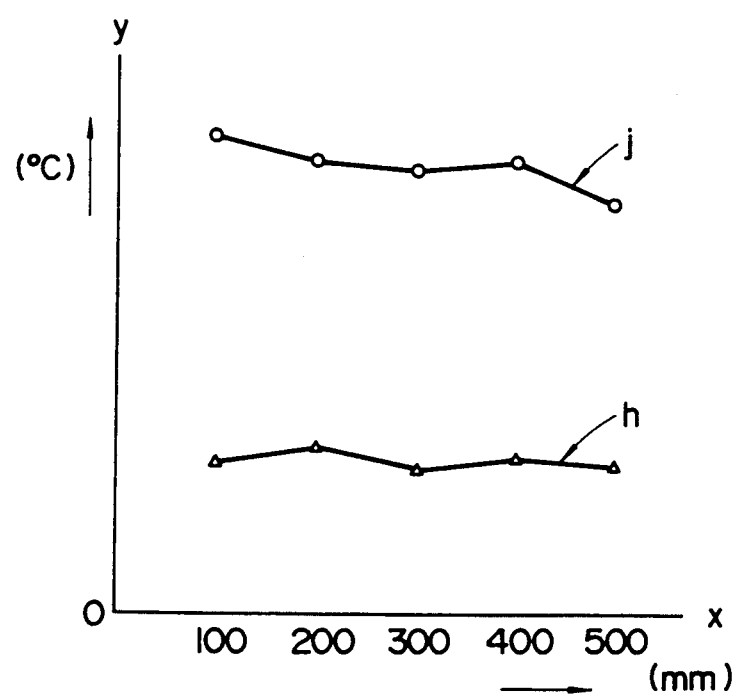
FIG. 6 is a graph showing the result of boiling experiment under a low temperature flow of working liquid in case of the experimental heat exchanger of FIG. 5 using the embodiment of the pipe for the cooling unit of FIG. 1 according to the present invention for an evaporating portion, and that in case of the experimental heat exchanger of FIG. 5 using the prior art pipe for the cooling unit of FIG. 2 for the evaporating portion.

In FIG. 6, the ordinate y represents a difference between the vapor temperature and the temperature of the wall surface (or the wall surface of the outer pipe 10 in case of using the pipe of the embodiment shown in FIG. 1) of the pipe in the evaporating portion c, and the abscissa x represents the length of the evaporating portion c. A line h represents the result of experiment in case of using the pipe of the embodiment shown in FIG. 1, and a line j represents the result of experiment in case of using the prior art cooling unit pipe. As is apparent from FIG. 6, when the pipe of the embodiment shown in FIG. 1 is used, the thermal conductivity is largely improved even under a low temperature flow of working liquid, in comparison with a case of using the prior art pipe.

Namely, in the low temperature flow through the prior art pipe, bubbles b stay on the level of working liquid a because of the boiling of only an outer peripheral portion of the level of working liquid a as shown in FIG. 2, so that the subsequent boiling of the working liquid is suppressed, and at the same time the distribution of temperature occurs below the bubbles b to degrade the thermal conductivity.

On the other hand, in the pipe for the cooling unit of the embodiment of FIG. 1, the working liquid a boils up almost in the circulation gap 13 between the outer pipe 10 and the inner pipe 11, and a portion of the working fluid a changed into a vapor phase results in a large number of bubbles b. These bubbles b are rapidly expanded by the boiling of succeeding working liquid a as they ascend within the circulation gap 13 in excess of the initial level of the working liquid a, and at the same time the unboiled working liquid a is lifted up to the upper end of the circulation gap 13, and then drops into the inner pipe 11.

In this manner, the bubbles b produced in the gap 13 do not stay in one spot by the continuous boiling produced in the circulation gap 13, and at the same time the unboiled liquid-phase portion also do not stay in one spot, so that not only the boiling is not hindered, but also the thermal conduction is promoted even under the low temperature flow by the turbulance of vapor and liquid within the gap 13. Therefore, the thermal conductivity is improved, and at the same time the operation is extremely stabilized.

Also, since the level of the working liquid a is made low, the quantity of working liquid enclosed in the piping is lessened, and the time taken from the start till the stationary running is made shorter.

An ascending force of the bubbles b in the circulation gap 13 between the outer pipe 10 and the inner pipe 11 becomes larger the narrower the circulation passage 13 is made, whereas the ascending force thereof becomes smaller the wider the circulation gap is made.

Since too wide circulation gap 13 between the outer pipe 10 and the inner pipe 11 loses its effect, whereas too narrow circulation gap brings about a dryout phenomenon, the circulation gap 13 should be properly set depending on the temperature of heat flow and the condition (density of spacers, irregularities or fins interposed between the outer pipe 10 and the inner pipe 11) within the circulation gap 13. Otherwise, in case of a pipe structure as described in the embodiment, the gap of about 0.2 to 0.8 mm on an average is preferable in case of heat flow of $1 \times 10^4$ w/m$^2$, and a value within 0.2 to 0.8 mm may be defined as the size of the circulation gap 13 as a first criterion.

The level of the working fluid a should be designed to be located between the opposite ends of the inner pipe 11, more preferably, located as lower as possible than the intermediate position of the opposite ends of the inner pipe 11. When the level of the working liquid a is brought close to the upper end, the distribution of temperature is liable to occur in the working liquid a inside the inner pipe 11.

Figure 3:
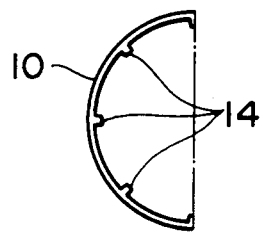
FIG. 3 is a fragmentary enlarged-scale end view showing a modification of an outer pipe of the pipe for the cooling unit according to the present invention.
Figure 4:
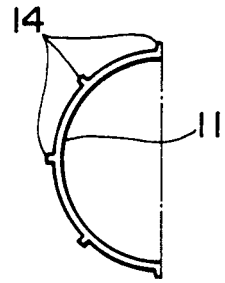
FIG. 4 is a fragmentary enlarged-scale end view showing a modification of an inner pipe of the pipe for the cooling unit according to the present invention.

In the pipe 1 for the cooling unit according to the present invention, instead of the projection portion 12 formed on the inner pipe 11 as noted above, a similar projection portion may be formed on the outer pipe 10, or the inner pipe having the smooth outer surface may be press fitted into the outer pipe 10 having the inner surface integrally formed with several fins or projection portions 14 as shown in FIG. 3. Otherwise, the inner pipe 11 having the outer peripheral surface similarly formed with several fins or projection portions 14 may be press fitted into the outer pipe.

Further, instead of the projection portion 12 or 14 as noted above, separate spacers (not shown) may be press fitted between the outer pipe 10 and the inner pipe 11 to such an extent that the circulation of working liquid a is not hindered.

Furthermore, in case where the circulation gap 13 is permitted to be made somewhat wider, the inner pipe 10, the outer pipe 11 and the spacers may be molded integrally by means of extrusion.

When the projection portions 12 or 14 or the spacers as noted above are provided close to the lower end of the inner pipe, a boil cavity is defined by the projection portions 12 or 14 or the spacers, and in particular, the working liquid boils up from the low-positioned boil cavity in the lower temperature flow, so that the thermal conductivity may be further improved, in comparison with the case of absence of any cavity.

Figure 7:
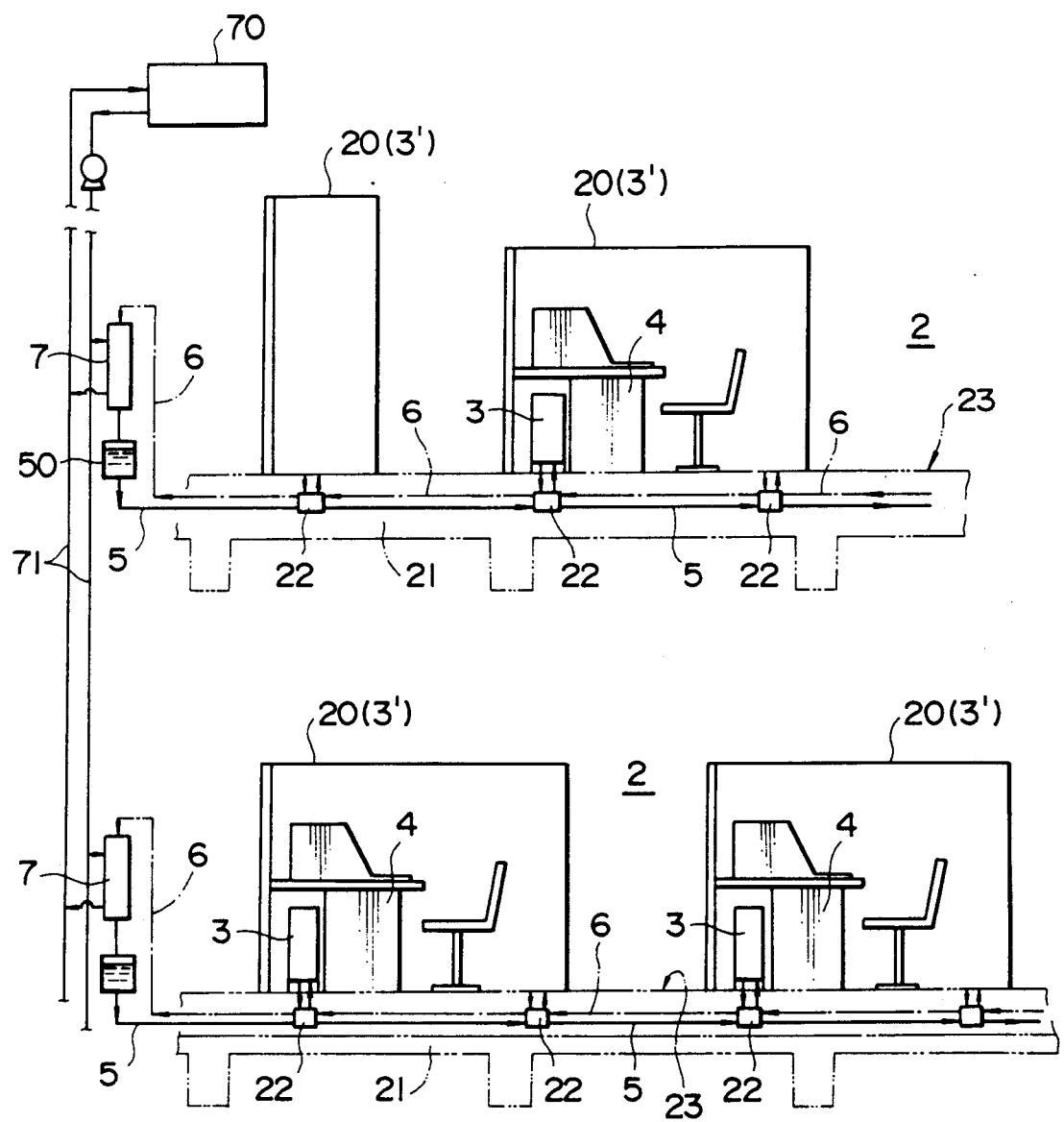
FIG. 7 is a schematic view, partly omitted, showing the constitution of an individual cooling system according to the present invention.

FIG. 7 shows an embodiment of an individual cooling system according to the present invention.

Referring to FIG. 7, exothermic apparatuses 4 such as information apparatuses and Office Automation apparatuses are installed in sections partitioned by partitions 20 on each floor 2 of a building, and the partitions 20 differ in height from each other.

Each exothermic apparatus 4 is installed with a cooling unit 3 in close to an exothermic portion of the apparatus 4, and each partition 20 serves as a cooling unit 3'.

A piping 5 of liquid-phase refrigerant shown by a solid line and a piping 6 of vapor-phase refrigerant shown by one dot-dash line are installed inside a floor slab 21 of each floor 2. Each cooling unit 3 has upper and lower header pipes, which will be later described, respectively connected to the piping 6 of vapor-phase refrigerant and the piping 5 of liquid-phase refrigerant through a pipe joint 22.

These pipings 5 and 6 of refrigerants are permitted to be installed inside conduit pipes (not shown) provided in the floor slab 21. Otherwise, in case of a double-floor like a residence, these pipes are permitted to be installed in the double floor.

The piping 5 of liquid-phase refrigerant is provided with a level regulator 50 at a certain level, whereby the level of working liquid in each cooling unit 3 is maintained to be at several tens cms above the floor surface 23 of the corresponding floor 2.

The piping 5 of liquid-phase refrigerant and the piping 6 of vapor-phase refrigerant respectively communicate to a terminal heat exchanger 7 installed at a proper place on each floor 2, and a cooling water piping 71 is provided to circulate water from a cold heat source 70 installed in a proper place of a building through the terminal heat exchanger 7 on each floor 2 again to the cold heat source 70. As for the cold heat source 70, use is preferably made of an ice regenerating unit in order to effectively utilize midnight electric power or to utilize as a back-up heat source in an emergency.

FIGS. 8 through 11 show a cooling unit according to the present invention for use in the individual cooling system of FIG. 7, respectively.

Referring to FIGS. 8 through 11, the cooling unit 3 installed in the neighborhood of the exothermic apparatus 4 is basically composed of several pipes 1 as detailed in FIG. 1 (Particularly see FIG. 10 in detail), which are arranged as standing side by side, wherein the upper end of each pipe 1 communicates to the upper header pipe 15, and the lower end of each pipe 1 communicates to the lower header pipe 16. The upper header pipe 15 communicates to the piping 6 of vapor-phase refrigerant of FIG. 7, and the lower header pipe 16 communicates to the piping 5 of liquid-phase refrigerant of FIG. 7, respectively.

Figure 10:
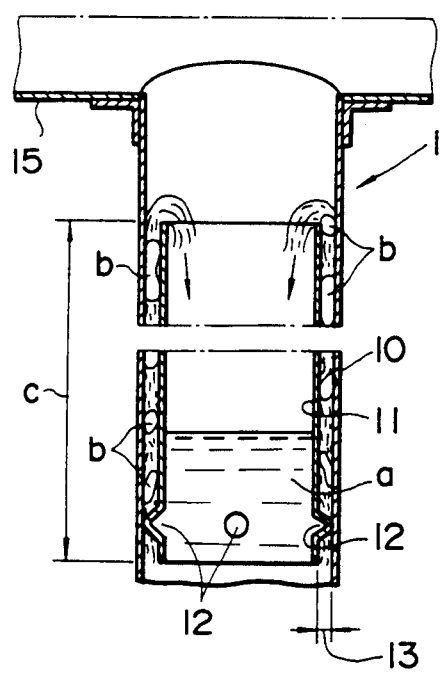
FIG. 10 is a fragmentary enlarged-scale sectional view showing the cooling unit of FIG. 8.

As shown in FIG. 10, the pipe 1 of the cooling unit 3 is so constituted that a short inner pipe 11 having a small diameter is inserted into the outer pipe 10 so that the inner pipe 11 is placed at the evaporating portion c, then projection portions 12 are formed by protruding a lower end portion of the inner pipe 11 toward the outer periphery at predetermined intervals, and then the inner pipe 11 is fixed to the inside of the outer pipe 10 through a narrow circulation gap 13. The upper end of the inner pipe 11 does not reach the upper header pipe 15.

Figure 11:
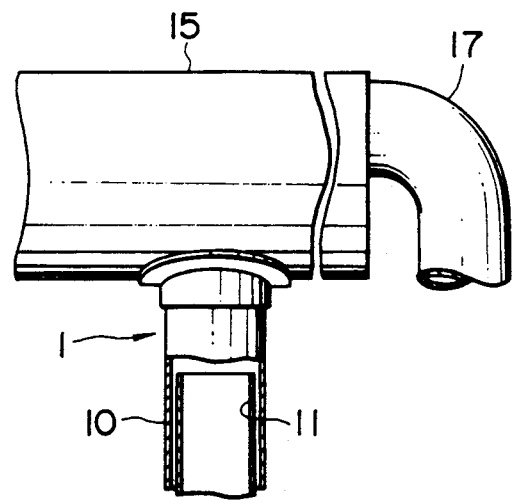
FIG. 11 is an enlarged-scale view showing a vapor-liquid separating portion in the cooling unit of FIG. 8.

As shown in FIG. 11, a vapor-liquid separating pipe 17 having the diameter smaller than that of the upper header pipe 15 communicates to the upper portion of one end of the upper header pipe 15, and the upper header pipe 15 is connected to the piping 6 of vapor-phase refrigerant of FIG. 1 through this vapor-liquid separating pipe 17. Even in case where the piping 6 of vapor-phase refrigerant is provided inside the floor slab 21 as shown in FIG. 7, the unboiled working liuqid a energetically ascending through the circulation gap 13 together with the bubbles b is adapted not to enter the piping 6 of vapor-phase refrigerant when the working liquid a successively boils up in the circulation gap 13 in the pipe 1 of FIG. 10.

Figure 12:
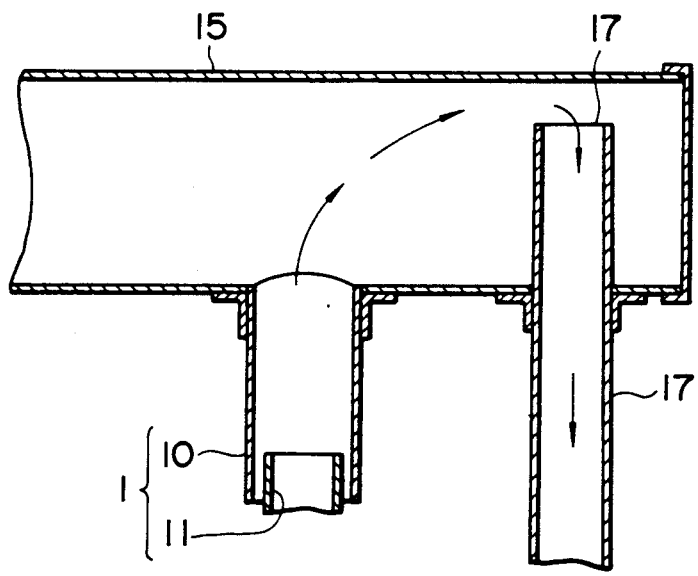
FIG. 12 is an enlarged-scale sectional view showing another example of the vapor-liquid separating portion in the cooling unit of FIG. 8.

The vapor-liquid separating pipe 17 sufficiently functions as long as the upper end of the pipe 17 communicates to the upper portion of the upper header pipe 15, so that a portion of the vapor-liquid separating structure may be constituted as shown in FIG. 12.

The cooling unit 3 of this embodiment is supported by a plurality of frames 30, each of which has a groove-like shape in cross-section and is extrusion-molded from aluminum alloy having good thermal conductivity.

The frame 30 is composed of a front heat-sensitive board 300 facing the exothermic portion of the exothermic apparatus of FIG. 7, side wall boards 301 having L-like shapes in cross-section and longitudinally extending from the back surface on opposite sides of the heat-sensitive board 300, and a plurality of trough-like grooves 302 having arcuate shapes in cross-section and longitudinally formed on the back surface of the heat-sensitive board 300 at predetermined intervals. The upper and lower header pipes 15 and 16 are supported by the side wall boards 301 as extending therethrough, and each pipe 1 is guided to the inside of the corresponding trough-like groove 302 so as to be brought into closely contact with the trough-like groove 302.

Figure 13:
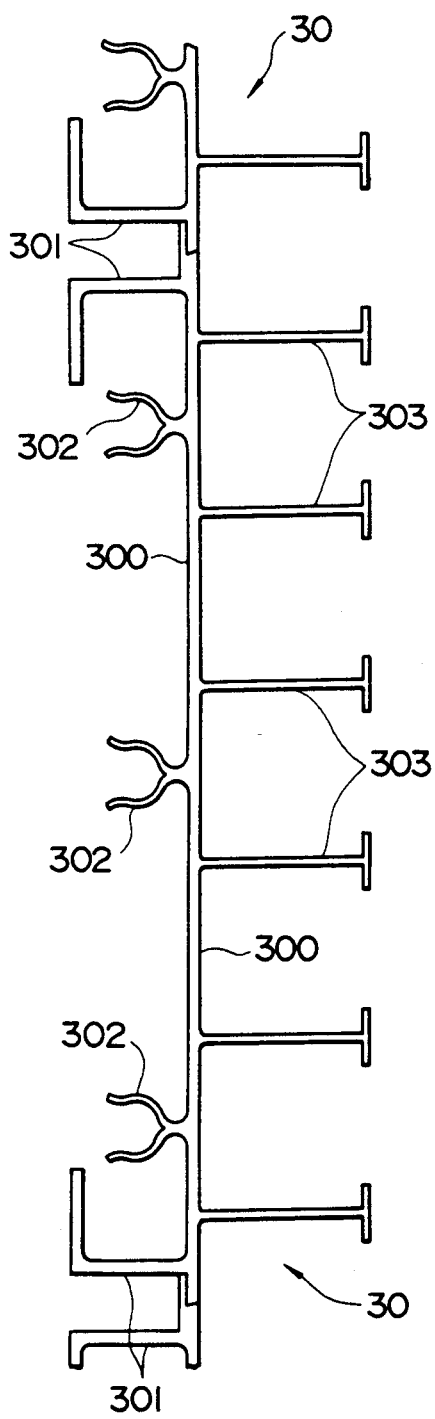
FIG. 13 is an enlarged-scale plan view showing a modification of a heat-sensitive frame in the cooling unit according to the present invention.

As shown in FIG. 13, a plurality of irregularities or heat-absorbing fins 303 are preferably formed on the front surface of the heat-sensitive board 300 of the frame 30.

Figure 8:
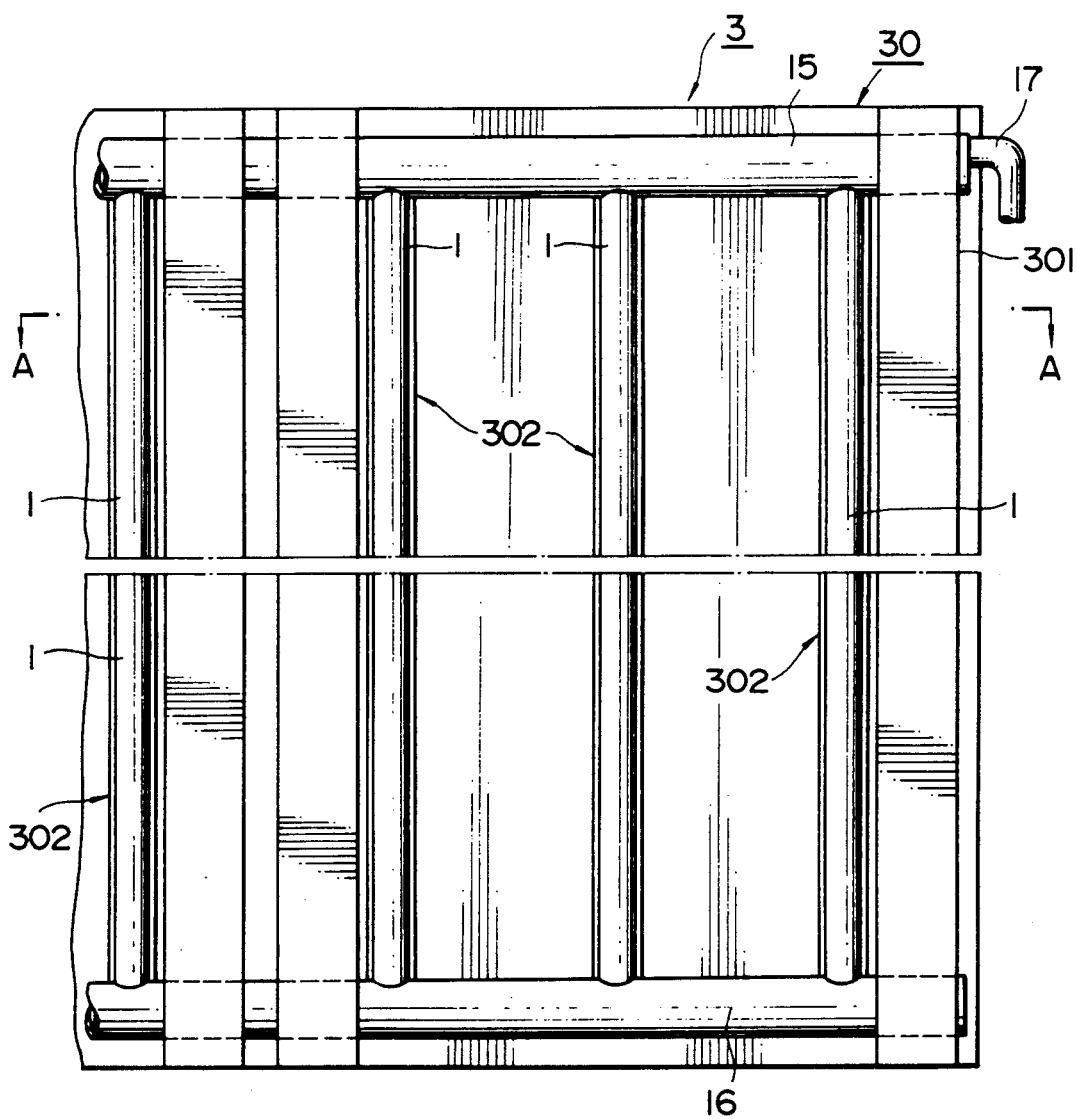
FIG. 8 is a fragmentary rear view showing a cooling unit for use in the individual cooling system of FIG. 7.
Figure 9:
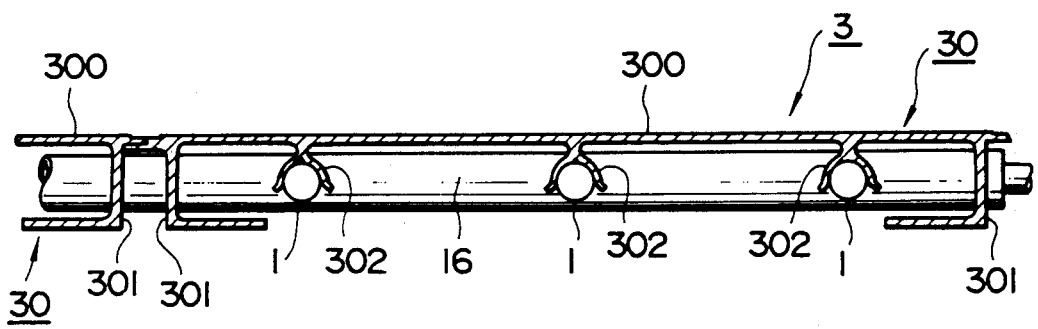
FIG. 9 is a sectional view taken along a line A—A indicated by an arrow in FIG. 8.
Figure 14:
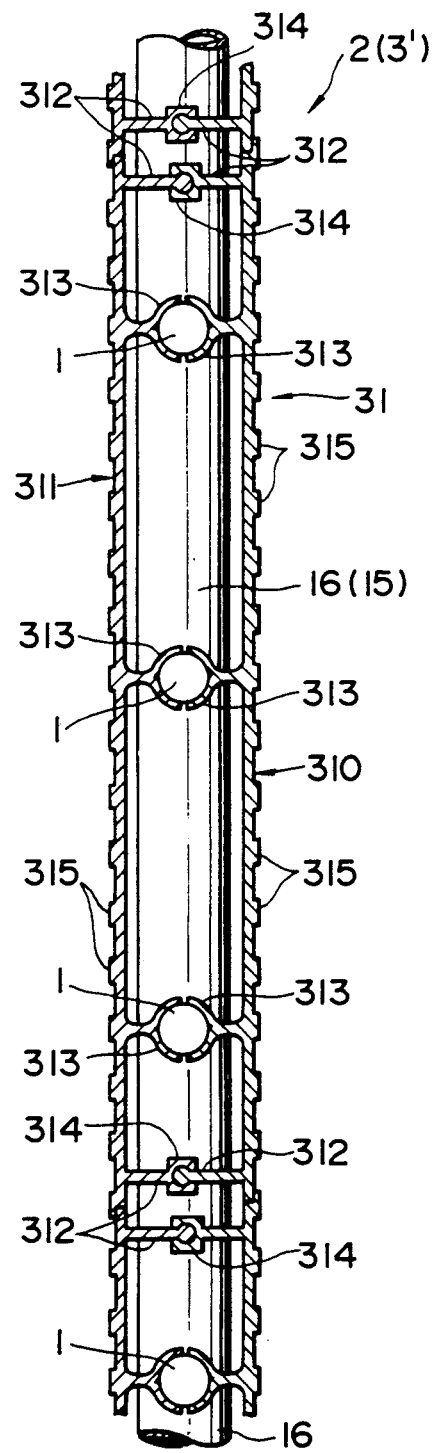
FIG. 14 is an enlarged-scale plan sectional view showing another cooling unit used in the individual cooling system of the embodiment of FIG. 7.

The partition 20 shown in FIG. 7 serves as the cooling unit 3', and the basic structure of the cooling unit 3' is substantially similar to that of the cooling unit 3 shown in FIGS. 8 through 11, except that the cooling unit 3' is provided with a hollow panel 31 made of aluminum alloy or like material having good thermal conductivity as shown in FIG. 14, instead of the frame 30 as shown in FIGS. 8 and 9.

The hollow panel 31 of the cooling unit 3' is composed of a front face board 310 and a back face board 311 respectively having side wall boards 312, 312 longitudinally extending from their back surfaces at opposite side ends, and a plurality of grooves 313 having arcuate shapes in cross-section and longitudinally provided on their inner surfaces such that the grooves 313 of the front face board 310 are aligned with the corresponding grooves 313 of the back face board 311, wherein the front face board 310 and the back face board 311 confront each other, and convex and concave fitting portions 314 at the distal ends of the respective side wall boards 312 are coupled with each other. The upper and lower header pipes 15 and 16 are supported by the coupled side wall boards 312 as extending therethrough, and each pipe 1 is supported by the confronting grooves 313 as being closely sandwiched between the opposed surfaces of the confronting grooves 313.

Even in this cooling unit 3', a vapor-liquid separating pipe 17 similar to that of FIG. 11 or 12 is communicated to the upper header pipe 16.

A plurality of irregularities or heat-absorbing fins 315 are preferably formed on the surface of the front face board 310 and that of the back face board 311.

While each of the cooling units 3 and 3' is operated under the condition that the level of the working liquid a is located between the lower end and the upper end of the inner pipe 11, each unit is preferably operaed under the condition that the level of the working liquid a is located in a position corresponding to a half or less of the total length of the inner pipe 11.

According to the individual cooling system of the embodiment, in each of the cooling units 3 and 3', the working liquid a boils up within the circulation gap 13 between the outer pipe 10 and the inner pipe 11 of the pipe 1 due to the exhaust heat of the exothermic apparatus 4 and the heat around the partition 20 to cool down the proximity of the evaporating portion. Then, the vapor resulting from the boiling of the working liquid a passes through the vapor-liquid separating pipe 17 and the piping 6 of vapor-phase refrigerant, and reaches the terminal heat exchanger 7 installed on the corresponding floor 2 to be condensed. The condensed vapor circulatingly returns to the inside of the pipe 1 of each of the cooling units 3 and 3' through the piping 5 of liquid-phase refrigerant.

If a valve (not shown) is disposed between the lower header pipe 16 of each of the cooling units 3 and 3' and the piping 5 of liquid-phase refrigerant, a space on the floor 2 where the corresponding cooling unit 3 or 3' is installed is individually cooled down according to the selection of a person who operates the valve in the space.

Since the cooling system of the embodiment is provided with the cooling unit 3 every one exothermic apparatus 4, the exhaust heat of the exothermic apparatus 4 is properly removed to maintain the apparatus 4 to be in a preferred condition. Also, since the partition 20 is constituted as the cooling unit 3', a peripheral portion of the partition 20 is cooled down by radiation to further improve the effect on cooling.

The ascending force of the bubbles b resulting from the boiling of the working liquid a within the circulation gap 13 is adjusted by narrowing or widening the circulation gap 13 of the pipe 1 in FIG. 10. By so doing, the preferred individual cooling is realized even if the length of the evaporating portion (length of the inner pipe 11) in each of the cooling units 3 and 3' varies, and besides the level of a portion to be cooled respectively varies.

FIG. 15 shows another embodiment of the cooling unit 3 or 3' used in the individual cooling system according to the present invention. In this embodiment, the upper and lower header pipes 15 and 16 are connected to the upper and lower ends of several vertical pipes 1 similarly to those shown in FIG. 1, and a plurality of continuous louver-like heat-absorbing fins 320 made of copper, aluminum or alloy of these metals are mounted on the respective pipes 1. The upper header pipe 15 is supported by a support board 322 mounted to an upper edge frame 321 as extending through the support board 322, and the lower header pipe 16 is supported by a support board 324 mounted to a lower edge frame 323 as extending through the support board 324. Then, side frames 325, 325 are mounted so as to cover not only the opposite sides of each of the upper and lower edge frames 321 and 323 but also the opposite sides of each fin 320.

The cooling unit 3 or 3' with this structure is more efficient in absorption of heat because of a plurality of louver-like heat-absorbing fins 320 mounted to the pipes 1, and also serves as the partition since one surface is not viewed from the other surface.

The other constitution and function of the cooling unit of this embodiment are similar to those of the cooling unit of FIGS. 8 through 11, so that the detailed description thereof will be omitted.

Figure 17:
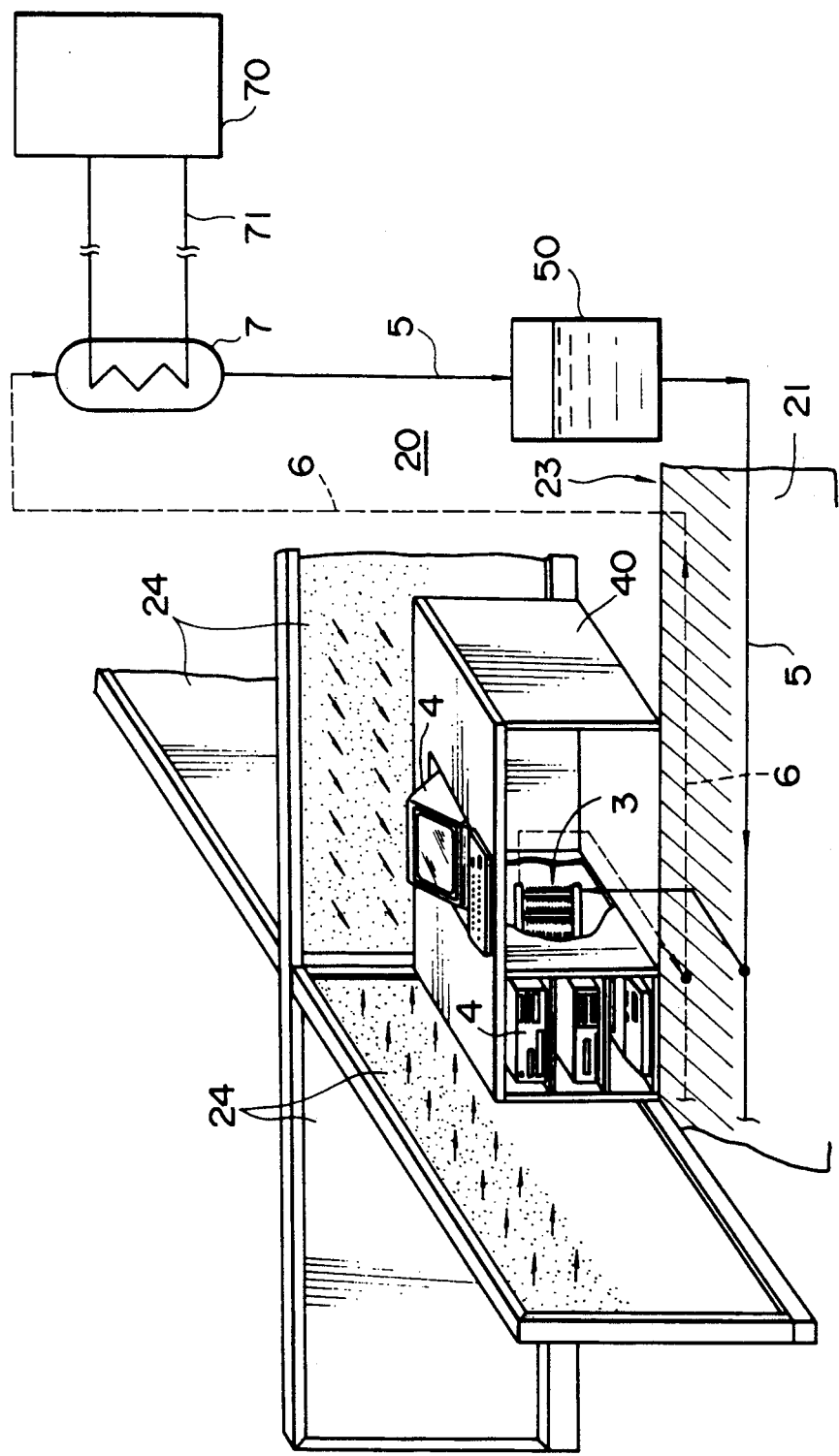
FIG. 17 is a schematic view showing the constitution of another embodiment of the individual cooling system according to the present invention.

FIG. 17 shows another embodiment of the cooling unit and the individual cooling system according to the present invention.

Referring to FIG. 17, the floor surface 23 of the floor 2 is partitioned by partitions 24 made of hollow panels, and a desk (table or cabinet) 40 provided with an Office Automation apparatus or like exothermic apparatus 4 is installed on each partitioned corner.

Figure 18:
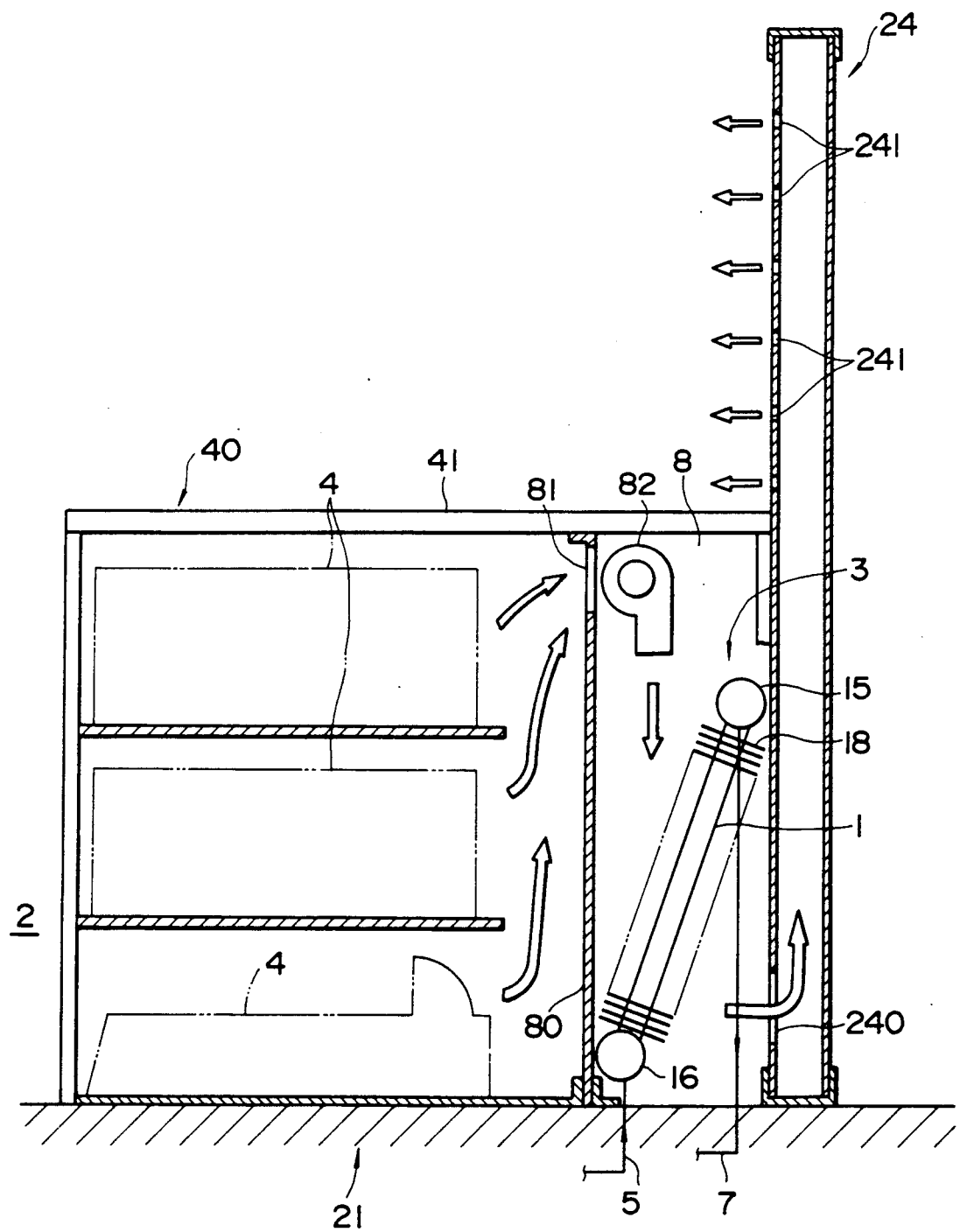
FIG. 18 is an enlarged-scale sectional view showing an essential portion in the individual cooling system of FIG. 17.

As shown in FIG. 18, a ventilating space 8 is defined below a top board 41 of the desk 40 and partitioned by a partition board 80 so as to communicate from the vicinity of the exothermic apparatus 4 to the inside of the hollow partition 24. In the ventilating space 8, there are installed a blower fan 82 in proximity to an air intake port 81 and the cooling unit 3 in proximity to a communication port 240 communicating from the ventilating space 8 to the inside of the partition 24.

A plurality of blow-off ports 241 consisting of small holes are formed in the relatively upper surface of the partition 24 which is directed to the space where the desk 40 is installed. In response to the operation of the blower fan 82, air including the exhaust heat of the exothermic apparatus 4 is introduced into the ventilating space 8 and then cooled down to a proper temperature with the cooling unit 3 installed within the ventilating space 8 to be blown off from the upper blow-off ports 241 through the partition 24 toward the desk 40 as a bleeze (with 0.8 mm/sec or less speed in this embodiment).

Figure 19:
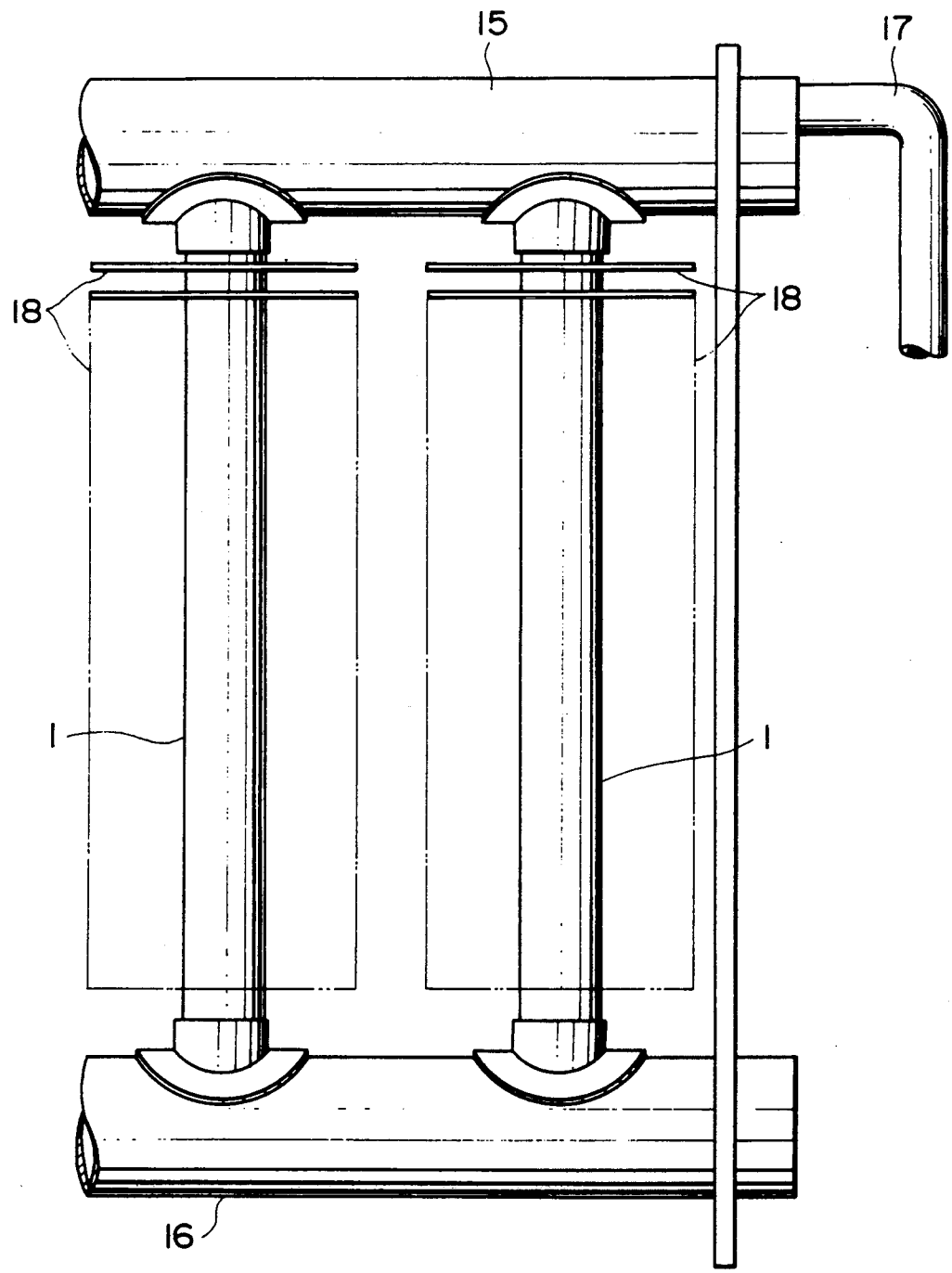
FIG. 19 is a fragmentary enlarged-scale front view showing a cooling unit used in the individual cooling system of FIG. 17.
Figure 20:
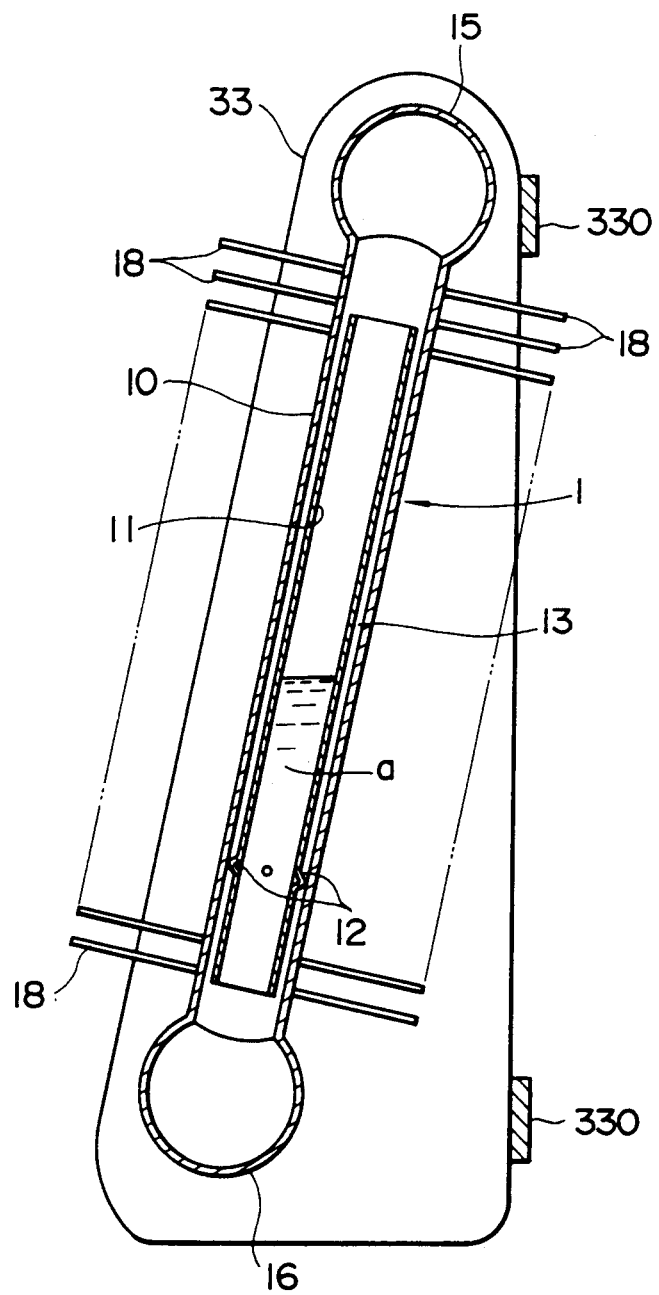
FIG. 20 is a longitudinal sectional view showing the individual cooling unit of FIG. 19.

As shown in FIGS. 18 through 20, the cooling unit 3 in this embodiment is so constituted that a plurality of pipes 1 similar to those of FIG. 1 are arranged as obliquely standing side by side at predetermined intervals, the upper header pipe 15 is connected to the upper end of each pipe 1 and the lower header pipe 16 is connected to the lower end of each pipe 1. In this structure, a plurality of heat-absorbing fins 18 are mounted to each pipe 1, and the upper and lower header pipes 15 and 16 are connected to each other through a connection board 330 (See FIG. 20) and supported by plate-like frames 33, 33 as extending therethrough.

Since the structure of the pipe 1 in this embodiment is substantially similar to that of the pipe 1 of FIG. 1, the portions corresponding to those of the pipe 1 of FIG. 1 are designated by the same numbers as those of the pipe 1 of FIG. 1, and the detailed description thereof will be omitted.

The upper header pipe 15 and the lower header pipe 16 of the cooling unit 3 respectively communicate to the piping 6 of vapor-phase refrigerant and the piping 5 of liquid-phase refrigerant, which are provided inside the floor slab 21 on each floor 2 shown in FIGS. 17 and 18, or inside the double-floor. The piping 5 of vapor-phase refrigerant and the piping 6 of liquid-phase refrigerant communicate to the terminal heat exchanger 7 which are located at a level higher than the cooling unit 3.

A level regulator 50 is provided at a proper level in the piping 5 of liquid-phase refrigerant, and the level of the working liquid a within the cooling unit 3 is set to be held at several tens cms above the floor surface 23 of the floor 2.

The vapor-liquid separating pipe 17 communicates to the upper portion of one end of the upper header pipe 15, and the upper header pipe 15 communicates to the piping 6 of vapor-phase refrigerant through the vapor-liquid separating pipe 17.

In case where a plurality of cooling units 3 are installed on the same floor 2, the upper and lower header pipes 15 and 16 of each cooling unit 3 respectively communicate to the piping 6 of vapor-phase refrigerant and the piping 5 of liquid-phase refrigerant, and each cooling unit 3 and the piping 5 of liquid phase refrigerant are isolated from each other by proper means like a valve (not shown).

As shown in FIG. 17, a cold heat source 70 is installed in a proper place of the building, and a cooling water piping 71 is provided to circulate water from the cold heat source 70 through the terminal heat exchanger 7 again to the cold heat source 70. As for the cold heat source 70, use is preferably made of an ice regenerating unit.

In case where the cooling units 3 are installed for a plurality of desks 40 or the like on each floor 2 of the building, the terminal heat exchanger 7 is installed on each floor, and the cold heat source 70 communicates to each terminal heat exchanger 7 through the cooling water piping 71.

Even in this individual cooling system, the cooling unit 3 is operated under the condition that the level of the working liquid a is located between the lower end and the upper end of the inner pipe 11. Preferably, the cooling unit 3 is operated under the condition that the level of the working liquid a is located at a position corresponding to a half or less of the total length of the inner pipe 11.

According to the individual cooling system of the embodiment, the exhaust heat of the exothermic apparatus 4 installed on the desk 40 or the like is fed to the cooling unit 3 by the use of the ventilating fan 82, and the working liquid within the pipe 1 of the cooling unit 3 boils up within the circulation gap 13, so that the exhaust heat fed to the cooling unit 3 is cooled down to a proper temperature to be blown off from the blow-off ports 241 of the hollow partition 24 as a bleeze. In this manner, the partitioned space is permitted to be held at a temperature suited for an effective temperature of a worker who operates therein.

Since the other function of the individual cooling system described in FIGS. 17 through 20 is similar to that of the individual cooling system described in FIGS. 7 through 11, the detailed description thereof will be omitted.

What is claimed is:

1. A cooling unit comprising:
  a plurality of pipe components for use in evaporating a working liquid confined at a level in each such component with heat absorbed by said each such component from a heat source external thereof, each component comprising an outer pipe and an inner pipe shorter than said outer pipe disposed in said outer pipe to therewith provide a component evaporation portion, a circulation gap being defined between the inner wall surface of said outer pipe and the outer wall surface of said inner pipe, said plurality of pipe components being arranged as standing side-by-side vertically or obliquely, working liquid present in the component evaporation portion being caused by absorbed heat to boil mainly in the circulation gap so that a vapor form of the liquid bubbles to an upper end of the circulation gap lifting unboiled liquid therewith to overflow of said unboiled liquid at an upper edge of said inner pipe for return flow to the working liquid level;
  an upper header pipe communicating with an upper end of each pipe component; and
  a lower header pipe communicating with a lower end of each pipe component.

2. A cooling unit according to claim 1, wherein said upper and lower header pipes are supported by a frame provided on a front surface thereof with a heat-sensitive board having high thermal conductivity, and each pipe component is received in a groove formed on a back surface of said heat-sensitive board.

3. A cooling unit according to claim 1, wherein said upper and lower header pipes are supported by side wall boards interconnecting a front face board and a back face board, the said side boards, front face board and rear face board comprising a hollow panel having high thermal conductivity, each pipe component being received in a groove formed on the inside of said hollow panel.

4. A cooling unit according to claim 1, wherein said upper and lower header pipes extend through and are supported on and by oppositely-located plate-like frames, and a plurality of heat-absorbing fins mounted on each pipe component.

5. A cooling unit according to claim 1, wherein a vapor-liquid separating pipe having a diameter smaller than a diameter of said upper header pipe is connected to said upper header pipe.

6. A cooling unit according to claim 2, wherein a plurality of heat-absorbing fins are formed on the heat-sensitive board.

7. A cooling unit according to claim 3, wherein a plurality of heat-absorbing fins are formed on one of a front face and a back face of the hollow panel.

8. A cooling unit according to claim 4, wherein said heat-absorbing fins are louver-like, and extend along the pipe components from the upper header pipes to the lower header pipes.

9. An individual cooling system, comprising:
a cooling unit including a plurality of pipe components for use in evaporating a working liquid confined at a level in each such component with heat absorbed by said each such component from a heat source external thereof, each component comprising an outer pipe and an inner pipe shorter than said outer pipe disposed in said outer pipe to therewith provide a component evaporating portion, a circulation gap being defined between the inner wall surface of said outer pipe and the outer wall surface of said inner pipe and leading from one end to the other end of said inner pipe, said plurality of pipe being arranged as standing side-by-side vertically or obliquely, working liquid present in the component evaporation portion being caused by absorbed heat to boil mainly in the circulation gap so that a vapor form of the liquid bubbles to an upper end of the circulation gap lifting unboiled liquid therewith to overflow of said unboiled liquid at an upper edge of said inner pipe for return flow to the working liquid level, an upper header pipe communicating with the upper end of each pipe component and a lower header pipe communicating with the lower end of each pipe component, said cooling unit being installed in the vicinity of an exothermic apparatus installed on a floor, in a hollow partition;
said lower header pipe of each cooling unit communicating with a piping of liquid-phase refrigerant provided inside structure of the corresponding floor;
said upper header pipe of each cooling unit communicating with a piping of vapor-phase refrigerant;
said liquid-phase refrigerant piping and said vapor-phase refrigerant piping communicating with a terminal heat exchanger; and
a liquid level regulator installed within the liquid-phase refrigerant piping.

10. An individual cooling system according to claim 9, wherein said upper header pipe of said cooling unit communicates with the vapor-phase refrigerant piping through a vapor-liquid separating pipe, and said vapor-phase refrigerant piping is provided inside of the corresponding floor structure.

11. An individual cooling system, comprising:
a cooling unit including a plurality of pipes, each of which is composed of an outer pipe and an inner pipe shorter than said outer pipe and located at an evaporating portion in said outer pipe, a circulation gap being defined between the inner wall surface of said outer pipe and the outer wall surface of said inner pipe and leading from one end to the other end of said inner pipe, said plurality of pipes being arranged as standing side-by-side vertically or obliquely, an upper header pipe communicating with the upper end of each pipe, and a lower header pipe communicating with the lower end of each pipe, said cooling unit being installed in a portion of a ventilating space communicating with the inside of a hollow partition from the vicinity of an exothermic apparatus installed on a support located on a floor partitioned by said hollow partition;
a blower fan installed in said ventilating space portion and directing an exhaust flow of air heated by said exothermic apparatus on to said cooling unit whereby said air is cooled, and passes into the inside of said partition;
a blow-off port formed in the surface of said partition, which is directed to the space where said exothermic apparatus is installed, and leading from the inside of said partition to the outside;
said lower header pipe of each cooling unit communicating with a piping of liquid-phase refrigerant provided inside structure of the corresponding floor;
said upper header pipe of each cooling unit communicating with a piping of vapor-phase refrigerant;
said liquid-phase refrigerant piping and said vapor-phase refrigerant piping communicating with a terminal heat exchanger; and
a liquid level regulator installed within the liquid-phase refrigerant piping.

12. An individual cooling system according to claim 11, wherein said upper header pipe of said cooling unit communicates with said vapor-phase refrigerant piping through a vapor-liquid separating pipe, and said vapor-phase refrigerant piping is provided inside structure of the corresponding floor.

13. An individual cooling system in a building having a plurality of floors, comprising:
a cooling unit installed on each of at least some of said floors, said cooling unit including a plurality of pipes, each of which is composed of an outer pipe and an inner pipe shorter than said outer pipe and located at an evaporating portion in said outer pipe, a circulation gap being defined between the inner wall surface of said outer pipe and the outer wall surface of said inner pipe and leading from one end to the other end of said inner pipe, said plurality of pipes being arranged as standing side-by-side vertically or obliquely, an upper header pipe communicating with the upper end of each pipe, and a lower header pipe communicating with the lower end of each pipe, said cooling unit being installed in the vicinity of an exothermic apparatus installed on the same floor, and/or within a hollow partition;
said lower header pipe of each cooling unit communicating with a piping of liquid-phase refrigerant provided inside structure of the corresponding floor;
said upper header pipe of each cooling unit communicating with a piping of vapor-phase refrigerant;
said liquid-phase refrigerant piping and said vapor-phase refrigerant piping communicating with a terminal heat exchanger;
a liquid level regulator installed within the liquid-phase refrigerant piping; and
a cooling water piping for circulating cooling water from a cold heat source installed in the building through each terminal heat exchanger and back to said cold heat source.

14. An individual cooling system in a building having a plurality of floors, comprising:

a cooling unit installed on each of at least some of said floors, said cooling unit including a plurality of pipes, each of which is composed of an outer pipe and an inner pipe shorter than said outer pipe and located at an evaporating portion in said outer pipe, a circulation gap being defined between the inner wall surface of said outer pipe and the outer wall surface of said inner pipe and leading from one end to the other end of said inner pipe, said plurality of pipes being arranged as standing side-by-side vertically or obliquely, an upper header pipe communicating with the upper end of each pipe, and a lower header pipe communicating with the lower end of each pipe, said cooling unit being installed in a portion of a ventilating space communicating with the inside of a hollow partition from the vicinity of an exothermic apparatus installed at a space on a floor partitioned by said hollow partition;

a blower fan installed in said ventilating space portion and directing an exhaust flow of air heated by said exothermic apparatus to said cooling unit whereby said air is cooled, and passes into the inside of said partition;

a blow-off port formed in the surface of said partition, which is directed to the space where said exothermic apparatus is installed, and leading from the inside of said partition to the outside;

said lower header pipe of each cooling unit communicating with a piping of liquid-phase refrigerant provided inside a floor structure of the corresponding floor;

said upper header pipe of each cooling unit communicating with a piping of vapor-phase refrigerant;

said liquid-phase refrigerant piping and said vapor-phase refrigerant piping communicating with a terminal heat exchanger;

a liquid level regulator installed within said liquid-phase refrigerant piping; and a cooling water piping for circulating cooling water from a cold heat source installed in said building through each terminal heat exchanger and back to said cold heat source.

15. A cooling unit pipe component for use in evaporating a working liquid confined therein with heat absorbed by the pipe component from a heat source external of the component said pipe component comprising an outer pipe, a shorter inner pipe disposed in said outer pipe to provide a component double pipe evaporating portion, and means carried on one of said outer and inner pipes for fixing an outer surface of said inner pipe spaced from an inner surface of said outer pipe therewith defining an evaporation portion circulation gap of a size in a range of about 0.1–1.5 mm., working liquid present in the evaporating portion at a level below an upper end of the evaporating portion when the component is vertically or obliquely oriented being caused by absorbed heat to boil mainly in the circulation gap so that a vapor form of the liquid bubbles to an upper end of the circulation gap lifting unboiled working liquid therewith to overflow of said unboiled liquid at an upper edge of said inner pipe whence it return flows to the working liquid level.

* * * * *